US010951209B1

United States Patent

(12) United States Patent
Liu

(10) Patent No.: US 10,951,209 B1
(45) Date of Patent: Mar. 16, 2021

(54) POWER ON READY SIGNAL GENERATING APPARATUS AND OPERATION METHOD THEREOF

(71) Applicant: HIMAX TECHNOLOGIES LIMITED, Tainan (TW)

(72) Inventor: Yu-Hsuan Liu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/655,238

(22) Filed: Oct. 17, 2019

(51) Int. Cl.
*H03K 17/22* (2006.01)
*G06F 1/3246* (2019.01)
*G06F 1/3206* (2019.01)

(52) U.S. Cl.
CPC ......... *H03K 17/223* (2013.01); *G06F 1/3206* (2013.01); *G06F 1/3246* (2013.01)

(58) Field of Classification Search
CPC .... H03K 17/223; G06F 1/3206; G06F 1/3246
USPC .................................................. 327/108–112
See application file for complete search history.

(56) References Cited

U.S. PATENT DOCUMENTS

2005/0270077 A1* 12/2005 Kwon .................. H03K 17/223 327/143
2014/0097873 A1 4/2014 Shi et al.
2016/0231763 A1 8/2016 Yem
2018/0254075 A1 9/2018 Ma

FOREIGN PATENT DOCUMENTS

CN 101453313 6/2009
TW I231091 4/2005
TW I658373 5/2019

OTHER PUBLICATIONS

"Office Action of Taiwan Counterpart Application", dated May 28, 2020, p. 1-p. 7.

* cited by examiner

*Primary Examiner* — Tomi Skibinkski
(74) *Attorney, Agent, or Firm* — JCIPRNET

(57) ABSTRACT

A power on ready (POR) signal generating apparatus and an operation method thereof are provided. The POR signal generating device includes a detection circuit and a control circuit. The detection circuit detects a target voltage. When the target voltage is ready, the detection circuit sets a POR signal to a ready state. The control circuit is coupled to the output terminal of the detection circuit to receive the POR signal. After the POR signal transitions from a not ready state to the ready state, the control circuit maintains the POR signal in the ready state, and the control circuit disables the detection circuit.

16 Claims, 5 Drawing Sheets

POWER ON READY SIGNAL GENERATING APPARATUS AND OPERATION METHOD THEREOF

BACKGROUND OF THE INVENTION

1. Field of the Invention

The invention generally relates to an electronic circuit, in particular to a power on ready (POR) signal generating device and an operation method thereof.

2. Description of Related Art

The operation of an electronic circuit relies on a stable power supply. When not ready, an unstable power voltage may possibly cause an error in the operation of the electronic circuit. A power on ready (POR) detection circuit may detect whether the power voltage is ready, and then inform the electronic circuit (a next stage of circuit) of a detection result (a POR signal). The electronic circuit may prevent an erroneous behavior at the initial stage of power-on according to the detection result, and perform normal operation after the power is ready.

In any case, the electronic circuit no longer needs the POR signal during normal operation, and the conventional POR detection circuit is always maintained in an enabled state during the normal operation of the electronic circuit, that is, the POR detection circuit continuously consumes power when no POR signal is needed.

It should be noted that the information disclosed in this Background section is only for enhancement of understanding of the background of the invention and therefore it may contain some information (or all information) that does not form the prior art that is already known to a person of ordinary skill in the art. Further, the information disclosed in the Background section does not mean that one or more problems was acknowledged by a person of ordinary skill in the art.

SUMMARY OF THE INVENTION

The invention provides a power on ready (POR) signal generating apparatus and an operation method thereof, which disable a detection circuit after a POR signal transitions from a not ready state to a ready state, so as to reduce the power consumption.

The POR signal generating apparatus of the invention includes a detection circuit and a control circuit. The detection circuit is configured to detect a target voltage. The detection circuit sets a POR signal to a ready state when the target voltage is ready. The control circuit is coupled to an output terminal of the detection circuit to receive the POR signal. The control circuit maintains the POR signal in the ready state, and the control circuit disables the detection circuit after the POR signal transitions from a not ready state to the ready state.

The operation method of a power on ready (POR) signal generating apparatus of the invention includes: detecting, by a detection circuit, a target voltage; setting, by the detection circuit, a POR signal to a ready state when the target voltage is ready; and maintaining, by a control circuit, the POR signal in the ready state, and disabling the detection circuit after the POR signal transitions from a not ready state to the ready state.

Based on the above, in the embodiments of the invention, the POR signal generating apparatus detects the target voltage by using the detection circuit. When the target voltage is ready, the detection circuit may set the POR signal to the ready state. The POR signal generating apparatus also checks the POR signal by using the control circuit. After the POR signal transitions from the not ready state to the ready state, the control circuit may maintain the POR signal in the ready state, and the control circuit may disable the detection circuit to reduce the power consumption.

In order to make the aforementioned and other objectives and advantages of the invention comprehensible, embodiments accompanied with figures are described in detail below.

DESCRIPTION OF THE EMBODIMENTS

Figure 1:
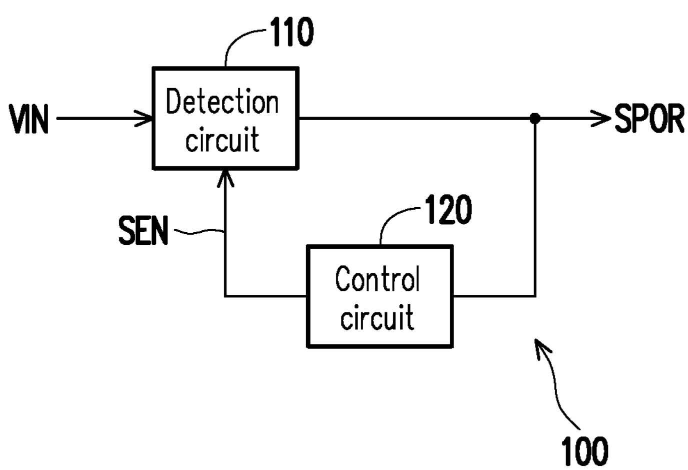
FIG. 1 is a schematic circuit block diagram of a power on ready (POR) signal generating apparatus according to an embodiment of the invention.

The term "coupled (or connected)" used in the entire specification (including the claims) may mean any direct or indirect connection means. For example, a first device coupled (connected) to a second device described herein should be interpreted as that the first device may be directly connected to the second device, or that the first device may be indirectly connected to the second device by other devices or by some means of connection. Terms such as "first" and "second" used in the entire specification (including the claims) are used to name components (elements) or to distinguish between different embodiments or ranges, and are not intended to define the upper or lower limit of the number of components or the order of components. Wherever possible, the same reference numbers are used in the drawings and the description to refer to the same or like parts, components or steps. For parts, components or steps denoted by same reference numbers or names, reference can be made to the related descriptions.

FIG. 1 is a schematic circuit block diagram of a power on ready (POR) signal generating apparatus 100 according to an embodiment of the invention. The POR signal generating apparatus 100 shown in FIG. 1 includes a detection circuit 110 and a control circuit 120. The detection circuit 110 may detect a target voltage VIN, and determines whether the target voltage VIN is ready. When the target voltage VIN is ready, the detection circuit 110 may set a POR signal SPOR to a ready state. The control circuit 120 is coupled to the output terminal of the detection circuit 110 to receive the POR signal SPOR. After the POR signal SPOR transitions from a not ready state to the ready state, the control circuit 120 may maintain the POR signal SPOR in the ready state, and the control circuit 120 may disable the detection circuit 110 via an enable signal SEN to reduce the power consumption.

Figure 2:
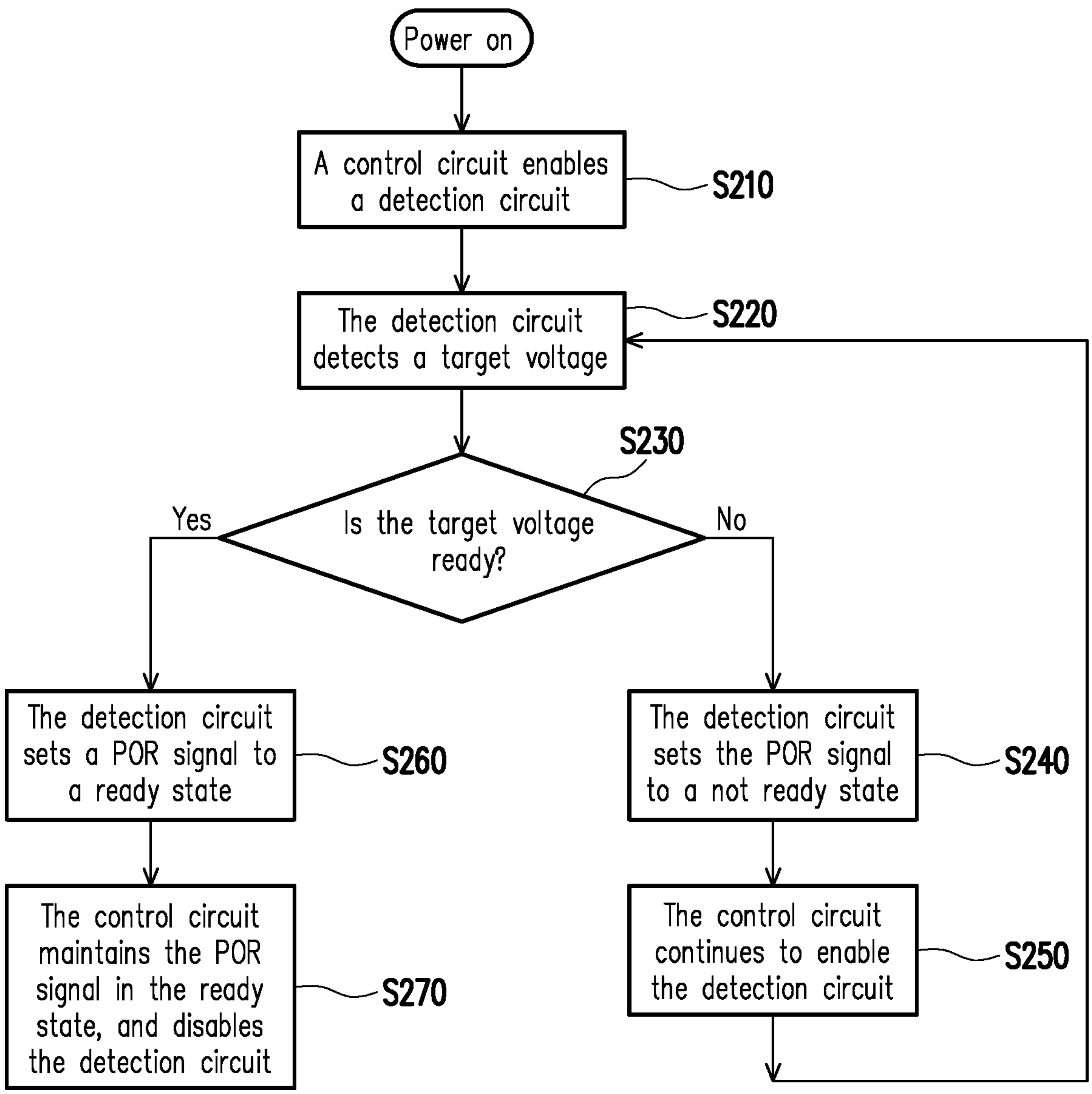
FIG. 2 is a schematic flow diagram of an operation method of a power on ready (POR) signal generating apparatus according to an embodiment of the invention.

FIG. 2 is a schematic flow diagram of an operation method of a power on ready (POR) signal generating apparatus according to an embodiment of the invention. Referring to FIG. 1 and FIG. 2, after the POR signal generating apparatus 100 is powered on, a POR signal SPOR is enabled to be in the not ready state (such as a low logic level or other levels) since a target voltage VIN is not ready. At this time, a control circuit 120 enables a detection circuit 110 via an enable signal SEN (Step S210). The enabled detection circuit 110 may detect the target voltage VIN (Step S220), and determines whether the target voltage VIN is ready (Step S230).

When the target voltage VIN is not ready (namely a determination result of Step S230 is "NO"), the detection circuit 110 may set the POR signal SPOR to the not ready state (Step S240). When the POR signal SPOR is in the not ready state, the control circuit 120 may continue to enable the detection circuit 110 via the enable signal SEN (Step S250). Therefore, the enabled detection circuit 110 may continue to detect the target voltage VIN (Step S220).

When the target voltage VIN is ready (namely a determination result of Step S230 is "YES"), the detection circuit 110 may set the POR signal SPOR to the ready state (such as a high logic level or other levels) (Step S260). After the POR signal SPOR transitions from the not ready state to the ready state, the control circuit 120 may maintain the POR signal SPOR in the ready state, and the control circuit 120 may disable the detection circuit 110 via the enable signal SEN to reduce the power consumption (Step S270).

Figure 3:
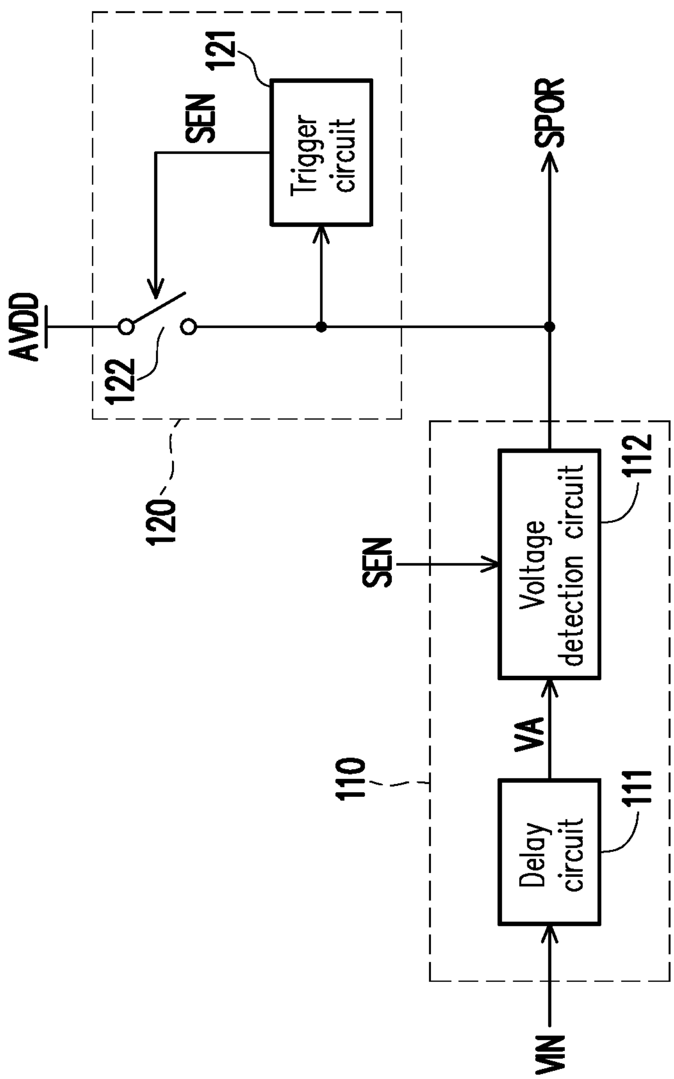
FIG. 3 is a schematic circuit block diagram of illustration of a detection circuit and a control circuit shown in FIG. 1 according to an embodiment of the invention.

FIG. 3 is a schematic circuit block diagram of illustration of the detection circuit 110 and the control circuit 120 shown in FIG. 1 according to an embodiment of the invention. In the embodiment shown in FIG. 3, the detection circuit 110 includes a delay circuit 111 and a voltage detection circuit 112. The input terminal of the delay circuit 111 may receive a target voltage VIN. In some embodiments, the target voltage VIN may be a power voltage AVDD of the detection circuit 110. In other embodiments, the target voltage VIN may be other voltages different from the power voltage AVDD. The output terminal of the delay circuit 111 outputs a delayed target voltage VA. By delaying the transmission of the target voltage VIN to the voltage detection circuit 112, it can be ensured that the voltage detection circuit 112 performs voltage detection on the target voltage VIN (the delayed target voltage VA) after completing a power-on procedure.

The input terminal of the voltage detection circuit 112 is coupled to the output terminal of the delay circuit 111 to receive the delayed target voltage VA. The voltage detection circuit 112 may compare the delayed target voltage VA with a reference voltage Vref (not shown in FIG. 3, detailed later) to obtain a comparison result. The voltage detection circuit 112 may set a POR signal SPOR according to the comparison result. It should be noted that the voltage detection circuit 112 is controlled by an enable signal SEN output by the control circuit 120. When the enable signal SEN enables the voltage detection circuit 112, the voltage detection circuit 112 may perform voltage detection on the target voltage VIN (the delayed target voltage VA), and correspondingly output the POR signal SPOR. The enable signal SEN may disable the voltage detection circuit 112 to reduce the power consumption of the voltage detection circuit 112.

In the embodiment shown in FIG. 3, the control circuit 120 includes a trigger circuit 121 and a switch 122. The input terminal of the trigger circuit 121 is coupled to the output terminal of the detection circuit 110 to receive the POR signal SPOR. The output terminal of the trigger circuit 121 outputs the enable signal SEN related to the POR signal SPOR. The first terminal of the switch 122 may receive the power voltage AVDD. The second terminal of the switch 122 is coupled to the output terminal of the detection circuit 110. The control terminal of the switch 122 is coupled to the output terminal of the trigger circuit 121 to receive the enable signal SEN. The trigger circuit 121 may check the POR signal SPOR. After the POR signal SPOR transitions from the not ready state to the ready state, the trigger circuit 121 may turn on the switch 122 via the enable signal SEN. Therefore, the control circuit 120 may maintain the POR signal SPOR in a high logic level (the ready state) after the POR signal SPOR transitions from the not ready state to the ready state. In addition, the trigger circuit 121 may disable the detection circuit 110 via the enable signal SEN to reduce the power consumption of the detection circuit 110 after the POR signal SPOR transitions from the not ready state to the ready state.

Figure 4:
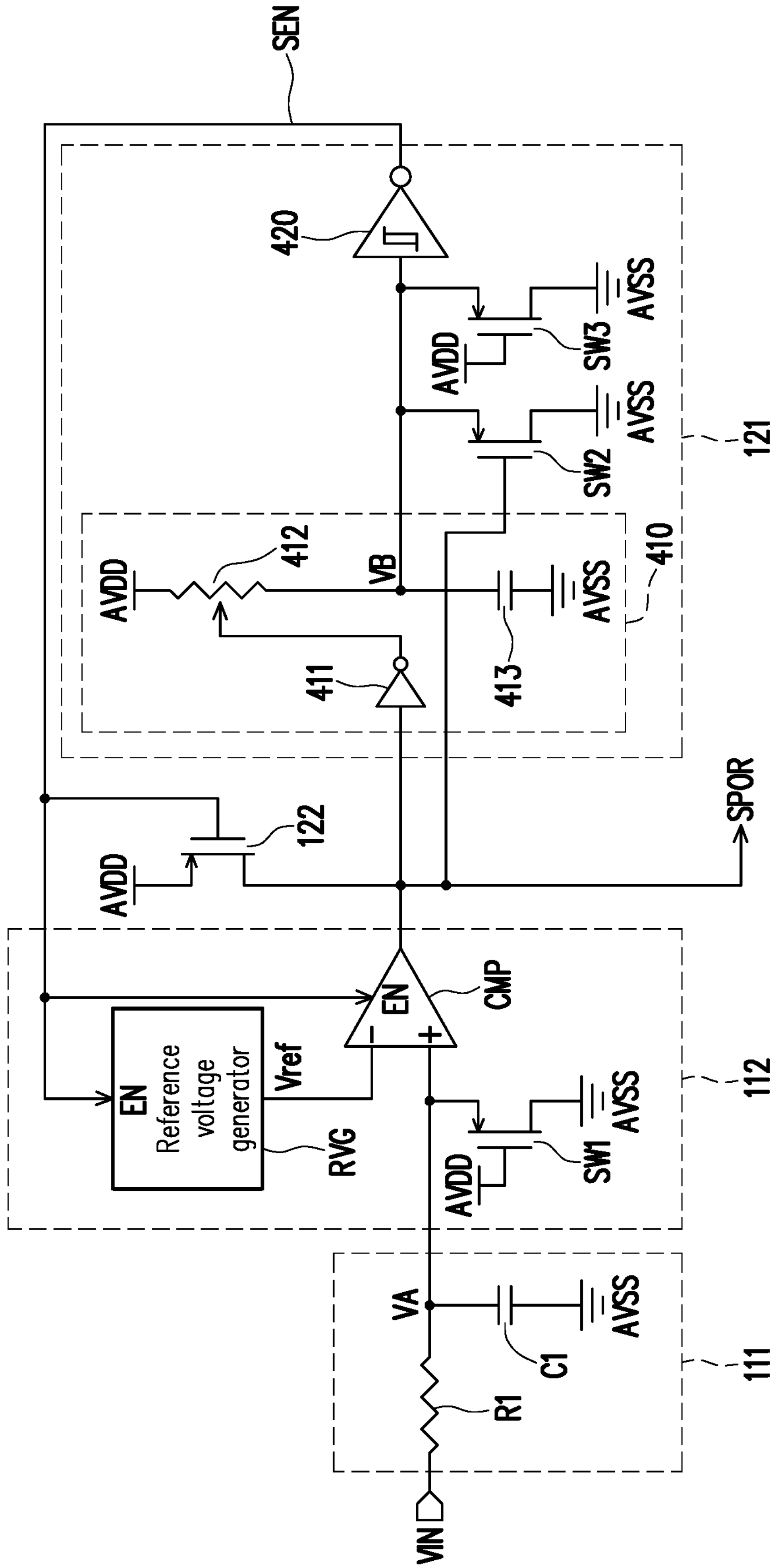
FIG. 4 is a schematic circuit block diagram of illustration of a delay circuit, a voltage detection circuit and a trigger circuit shown in FIG. 3 according to an embodiment of the invention.

FIG. 4 is a schematic circuit block diagram of illustration of the delay circuit 111, the voltage detection circuit 112 and the trigger circuit 121 shown in FIG. 3 according to an embodiment of the invention. In the embodiment shown in FIG. 4, the delay circuit 111 includes a resistor R1 and a capacitor C1. The first terminal of the resistor R1 may receive the target voltage VIN. The second terminal of the resistor R1 outputs the delayed target voltage VA to the voltage detection circuit 112. The first terminal of the capacitor C1 is coupled to the second terminal of the resistor R1. The second terminal of capacitor C1 receives a reference voltage (such as a grounding voltage AVSS or other fixed voltages).

In the embodiment shown in FIG. 4, the voltage detection circuit 112 includes a voltage comparator CMP, a switch SW1 and a reference voltage generator RVG. The first input terminal of the voltage comparator CMP is coupled to the output terminal of the delay circuit 111 to receive the delayed target voltage VA. The reference voltage generator RVG is coupled to the second input terminal of the voltage comparator CMP to provide the reference voltage Vref. The reference voltage generator RVG may include a bandgap voltage generating circuit and/or other voltage circuits according to design requirements. For example, the reference voltage generator RVG may include a conventional reference voltage generator or other reference voltage generating circuits.

The enable terminal EN of the reference voltage generator RVG is coupled to the trigger circuit 121 to receive the enable signal SEN. Based on the control of the enable signal SEN, the control circuit 120 may disable the reference voltage generator RVG to reduce the power consumption of the reference voltage generator RVG after the POR signal SPOR transitions from the not ready state to the ready state. For example, the enable signal SEN may determine whether to cut off the power of the reference voltage generator RVG to reduce the power consumption.

The first input terminal and the second input terminal of the voltage comparator CMP receive the delayed target voltage VA and the reference voltage Vref, respectively. The voltage comparator CMP may compare the delayed target voltage VA with the reference voltage Vref to obtain a comparison result. The output terminal of the voltage comparator CMP may output the comparison result as the POR signal SPOR. The enable terminal EN of the voltage comparator CMP is coupled to the trigger circuit 121 to receive the enable signal SEN. Based on the control of the enable signal SEN, after the POR signal SPOR transitions from the not ready state to the ready state, the control circuit 120 may disable the voltage comparator CMP to reduce the power consumption of the voltage comparator CMP. For example, the enable signal SEN may determine whether to cut off the power of the voltage comparator CMP to reduce the power consumption.

The first terminal of the switch SW1 is coupled to the first input terminal of the voltage comparator CMP. The second terminal of the switch SW1 receives the reference voltage (such as the grounding voltage AVSS or other fixed voltages). The control terminal of the switch SW1 receives the power voltage AVDD of the detection circuit 110. Based on the control of the power voltage AVDD, when the detection circuit 110 is not powered on, the switch SW1 is turned on. When the detection circuit 110 is powered on, the switch SW1 is turned off.

In the embodiment shown in FIG. 4, the trigger circuit 121 includes a delay circuit 410 and a buffer 420. The input terminal of the delay circuit 410 is coupled to the output terminal of the detection circuit 110 to receive the POR signal SPOR. The output terminal of the delay circuit 410 outputs a delayed signal VB to the buffer 420. The input terminal of the buffer 420 is coupled to the output terminal of the delay circuit 410 to receive the delayed voltage VB. The output terminal of the buffer 420 outputs the enable signal SEN to the switch 122, the voltage comparator CMP and the reference voltage generator RVG. The buffer 420 may include a NOT gate, a schmitt trigger and/or other buffer circuits according to the design requirements.

In the embodiment shown in FIG. 4, the delay circuit 410 includes a buffer 411, a variable resistor 412 and a capacitor 413. The input terminal of the buffer 411 is coupled to the output terminal of the detection circuit 110 to receive the POR signal SPOR. The buffer 411 may include a NOT gate, a schmitt trigger and/or other buffer circuits according to the design requirements. The first terminal of the variable resistor 412 may receive the power voltage AVDD. The second terminal of the variable resistor 412 outputs the delayed signal VB. The control terminal of the variable resistor 412 is coupled to the output terminal of the buffer 411. The first terminal of the capacitor 413 is coupled to the second terminal of the variable resistor 412. The second terminal of the capacitor 413 receives a reference voltage (such as the grounding voltage AVSS or other fixed voltages).

In the embodiment shown in FIG. 4, the trigger circuit 121 may also selectively include a switch SW2 according to the design requirements. The first terminal of the switch SW2 is coupled to the input terminal of the buffer 420. The second terminal of the switch SW2 receives the reference voltage (such as the grounding voltage AVSS or other fixed voltages). The control terminal of the switch SW2 is coupled to the output terminal of the detection circuit 110 to receive the POR signal SPOR. When the POR signal SPOR is in the ready state, the switch SW2 is turned off. When the POR signal SPOR is in the not ready state, the switch SW2 is turned on.

In the embodiment shown in FIG. 4, the trigger circuit 121 may also selectively include a switch SW3 according to the design requirements. The first terminal of the switch SW3 is coupled to the input terminal of the buffer 420. The second terminal of the switch SW3 receives the reference voltage (such as the grounding voltage AVSS or other fixed voltages). The control terminal of the switch SW3 may receive the power voltage AVDD of the control circuit 120. When the control circuit 120 is not powered on, the switch SW3 is turned on. When the control circuit 120 is powered on, the switch SW3 is turned off.

Figure 5:
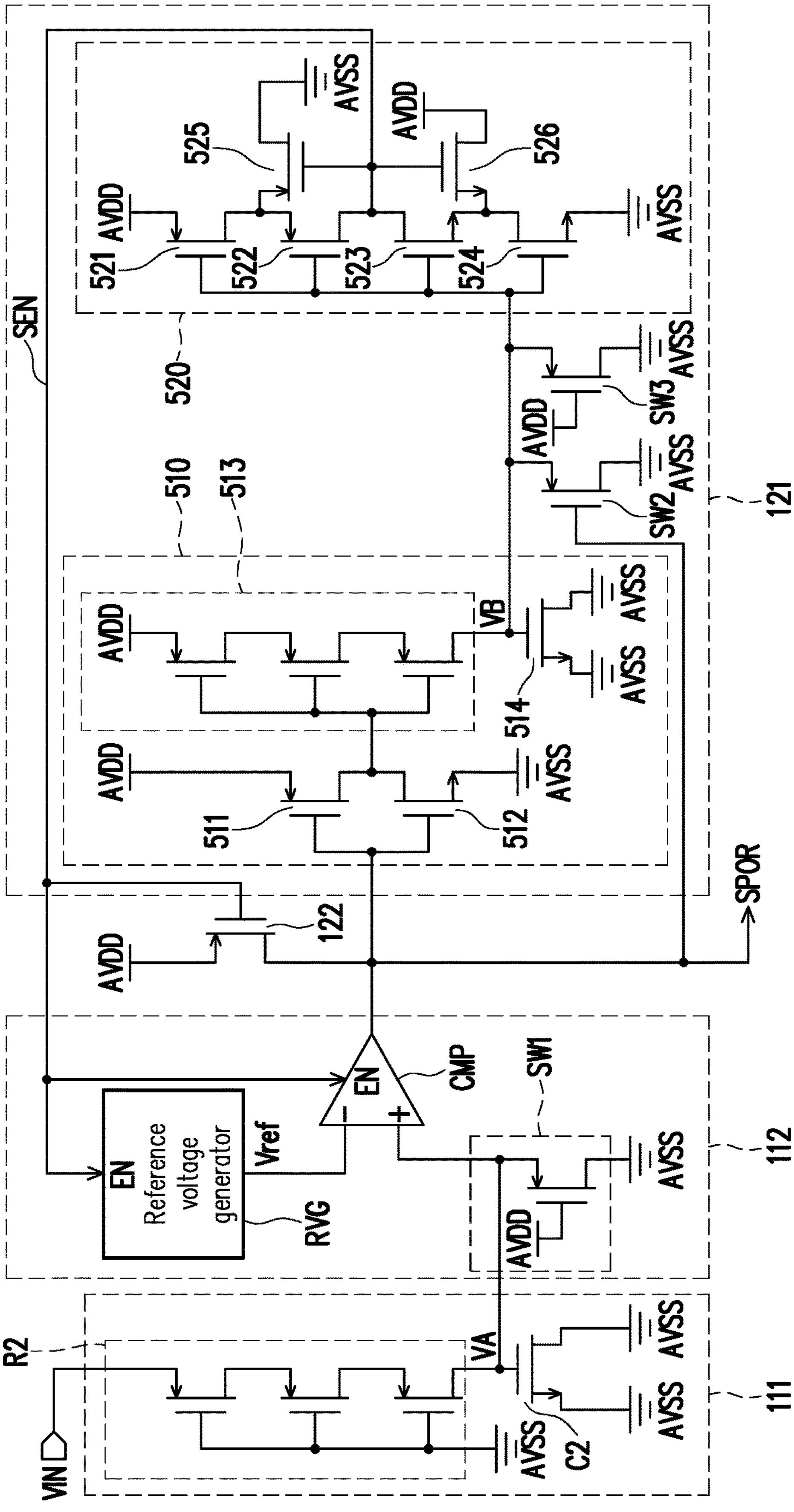
FIG. 5 is a schematic circuit block diagram of illustration of a delay circuit and a trigger circuit shown in FIG. 3 according to another embodiment of the invention.

FIG. 5 is a schematic circuit block diagram of illustration of the delay circuit 111 and the trigger circuit 112 shown in FIG. 3 according to another embodiment of the invention. The voltage detection circuit 112 shown in FIG. 5 may refer to the related description of the voltage detection circuit 112 shown in FIG. 4, and the description thereof is omitted. In the embodiment shown in FIG. 5, the delay circuit 111 includes a transistor string R2 and a transistor C2. The first terminal (e.g., the source electrode) of the transistor string R2 may receive a target voltage VIN. The second terminal (e.g., the drain electrode) of the transistor string R2 outputs a delayed target voltage VA to the voltage detection circuit 112. The control terminal (e.g., the gate electrode) of the transistor string R2 receives a bias voltage (such as a grounding voltage AVSS or other fixed voltages). The control terminal (e.g., the gate electrode) of the transistor C2 is coupled to the second terminal of the transistor string R2. The first terminal (e.g., the source electrode) and the second terminal (e.g., the drain electrode) of transistor C2 receive a reference voltage (such as the grounding voltage AVSS or other fixed voltages).

In the embodiment shown in FIG. 5, the trigger circuit 121 includes a delay circuit 510, a buffer 520, a switch SW2 and a switch SW3. The delay circuit 510, the buffer 520, the switch SW2 and the switch SW3 shown in FIG. 5 may refer to the related descriptions of the delay circuit 410, the buffer 420, the switch SW2 and the switch SW3 shown in FIG. 4, and the descriptions thereof are omitted.

The delay circuit 510 shown in FIG. 5 includes a transistor 511, a transistor 512, a transistor string 513 and a transistor 514. The control terminal (e.g., the gate electrode) of the transistor 511 and the control terminal (e.g., the gate electrode) of the transistor 512 are coupled to the output terminal of the detection circuit 110 to receive the POR signal SPOR. The first terminal (e.g., the source electrode) of the transistor 511 may receive the power voltage AVDD. The first terminal (e.g., the drain electrode) of the transistor 512 is coupled to the second terminal (e.g., the drain electrode) of the transistor 511. The second terminal of transistor 512 receives a reference voltage (such as the grounding voltage AVSS or other fixed voltages).

The first terminal (e.g., the source electrode) of the transistor string 513 may receive the power voltage AVDD. The second terminal (e.g., the drain electrode) of the transistor string 513 outputs the delayed signal VB. The control terminal (e.g., the gate electrode) of the transistor string 513 is coupled to the second terminal of the transistor 511 and the first terminal of the transistor 512. The control terminal (e.g., the gate electrode) of the transistor 514 is coupled to the second terminal of the transistor string 513. The first terminal (e.g., the source electrode) and the second terminal (e.g., the drain electrode) of the transistor 514 receive the reference voltage (such as the grounding voltage AVSS or other fixed voltages).

In the embodiment shown in FIG. 5, the buffer 520 includes a transistor 521, a transistor 522, a transistor 523, a transistor 524, a transistor 525 and a transistor 526. The control terminal (e.g., the gate electrode) of the transistor 521, the control terminal (e.g., the gate electrode) of the transistor 522, the control terminal (e.g., the gate electrode) of the transistor 523 and the control terminal (e.g., the gate electrode) of the transistor 524 are coupled to the output terminal of the delay circuit 110 to receive the delayed signal VB. The first terminal (e.g., the source electrode) of the transistor 521 may receive the power voltage AVDD. The first terminal (e.g., the source electrode) of the transistor 522 is coupled to the second terminal (e.g., the drain electrode) of the transistor 521. The second terminal (e.g., the drain electrode) of the transistor 522 outputs an enable signal SEN to the switch 122, the voltage comparator CMP and the reference voltage generator RVG. The first terminal (e.g., the drain electrode) of the transistor 523 is coupled to the second terminal of the transistor 522. The first terminal (e.g., the drain electrode) of the transistor 524 is coupled to the second terminal (e.g., the source electrode) of the transistor 523. The second terminal (e.g., the source electrode) of the transistor 524 receives a reference voltage (such as the grounding voltage AVSS or other fixed voltages).

The control terminal (e.g., the gate electrode) of the transistor 525 is coupled to the second terminal of the transistor 522 and the first terminal of the transistor 523. The first terminal (e.g., the source electrode) of the transistor 525 is coupled to the second terminal of the transistor 521 and the first terminal of the transistor 522. The second terminal (e.g., the drain electrode) of the transistor 525 receives the reference voltage (such as the grounding voltage AVSS or other fixed voltages). The control terminal (e.g., the gate electrode) of the transistor 526 is coupled to the second terminal of the transistor 522 and the first terminal of the transistor 523. The first terminal (e.g., the source electrode) of the transistor 526 is coupled to the second terminal of the transistor 523. The second terminal (e.g., the drain electrode) of the transistor 526 receives the power voltage AVDD.

Based on the above, in the embodiments of the invention, the POR signal generating apparatus 100 may detect the target voltage VIN by using the detection circuit 110. When the target voltage VIN is ready, the detection circuit 110 may set the POR signal SPOR to the ready state. The POR signal generating apparatus 100 may also check the POR signal SPOR by using the control circuit 120. After the POR signal SPOR transitions from the not ready state to the ready state, the control circuit 120 may maintain the POR signal SPOR in the ready state, and the control circuit 120 may disable the detection circuit 110 to reduce the power consumption.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A power on ready (POR) signal generating apparatus, comprising:

a detection circuit, configured to detect a target voltage, wherein the detection circuit sets a POR signal to a ready state when the target voltage is ready, wherein the detection circuit comprises:

a delay circuit, comprising an input terminal configured to receive the target voltage, wherein an output terminal of the delay circuit outputs a delayed target voltage; and a voltage detection circuit, comprising an input terminal coupled to the output terminal of the delay circuit, wherein the voltage detection circuit compares the delayed target voltage with a first reference voltage to obtain a comparison result, and the voltage detection circuit sets the POR signal according to the comparison result; and a control circuit, coupled to an output terminal of the detection circuit to receive the POR signal, wherein the control circuit maintains the POR signal in the ready state and disables the detection circuit after the POR signal transitions from a not ready state to the ready state.

2. The POR signal generating apparatus according to claim 1, wherein the control circuit enables the detection circuit when the POR signal is in the not ready state.

3. The POR signal generating apparatus according to claim 1, wherein the delay circuit comprises:

a resistor, comprising a first terminal configured to receive the target voltage, wherein a second terminal of the resistor outputs the delayed target voltage; and a capacitor, comprising a first terminal coupled to the second terminal of the resistor, wherein a second terminal of the capacitor receives a second reference voltage.

4. The POR signal generating apparatus according to claim 1, wherein the delay circuit comprises:

a transistor string, comprising a first terminal configured to receive the target voltage, wherein a second terminal of the transistor string outputs the delayed target voltage, and a control terminal of the transistor string receives a bias voltage; and a transistor, comprising a control terminal coupled to the second terminal of the transistor string, wherein a first terminal and a second terminal of the transistor receive a second reference voltage.

5. The POR signal generating apparatus according to claim 1, wherein the voltage detection circuit comprises:

a voltage comparator, comprising a first input terminal coupled to the output terminal of the delay circuit to receive the delayed target voltage, wherein a second input terminal of the voltage comparator receives the first reference voltage, and an output terminal of the voltage comparator outputs the POR signal;

wherein the control circuit disables the voltage comparator after the POR signal transitions from the not ready state to the ready state.

6. The POR signal generating apparatus according to claim 5, wherein the voltage detection circuit further comprises:

a switch, comprising a first terminal coupled to the first input terminal of the voltage comparator, wherein a second terminal of the switch receives a second reference voltage;

wherein the switch is turned on when the detection circuit is not powered on, and the switch is turned off when the detection circuit is powered on.

7. The POR signal generating apparatus according to claim 5, wherein the voltage detection circuit further comprises:

a reference voltage generator, coupled to the second input terminal of the voltage comparator to provide the first reference voltage;

wherein the control circuit disables the reference voltage generator after the POR signal transitions from the not ready state to the ready state.

8. The POR signal generating apparatus according to claim 1, wherein the control circuit comprises:

a trigger circuit, comprising an input terminal coupled to the output terminal of the detection circuit to receive the POR signal, wherein an output terminal of the trigger circuit outputs an enable signal related to the POR signal; and a first switch, comprising a first terminal configured to receive a power voltage, wherein a second terminal of the first switch is coupled to the output terminal of the detection circuit, and a control terminal of the first switch is coupled to the output terminal of the trigger circuit to receive the enable signal;

wherein the enable signal turns on the first switch after the POR signal transitions from the not ready state to the ready state.

9. A power on ready (POR) signal generating apparatus, comprising:

a detection circuit, configured to detect a target voltage, wherein the detection circuit sets a POR signal to a ready state when the target voltage is ready; and a control circuit, coupled to an output terminal of the detection circuit to receive the POR signal, wherein the control circuit maintains the POR signal in the ready state and disables the detection circuit after the POR signal transitions from a not ready state to the ready state, wherein the control circuit comprises:

a trigger circuit, comprising an input terminal coupled to the output terminal of the detection circuit to receive the POR signal, wherein an output terminal of the trigger circuit outputs an enable signal related to the POR signal; and a first switch, comprising a first terminal configured to receive a power voltage, wherein a second terminal of the first switch is coupled to the output terminal of the detection circuit, and a control terminal of the first switch is coupled to the output terminal of the trigger circuit to receive the enable signal;

wherein the enable signal turns on the first switch after the POR signal transitions from the not ready state to the ready state, wherein the trigger circuit comprises:

a delay circuit, comprising an input terminal coupled to the output terminal of the detection circuit to receive the POR signal, wherein an output terminal of the delay circuit outputs a delayed signal; and a first buffer, comprising an input terminal coupled to the output terminal of the delay circuit to receive the delayed signal, wherein an output terminal of the buffer outputs the enable signal.

10. The POR signal generating apparatus according to claim 9, wherein the delay circuit comprises:

a second buffer, comprising an input terminal coupled to the output terminal of the detection circuit to receive the POR signal;

a variable resistor, comprising a first terminal configured to receive the power voltage, wherein a second terminal of the variable resistor outputs the delayed signal, and a control terminal of the variable resistor is coupled to an output terminal of the second buffer; and a capacitor, comprising a first terminal coupled to the second terminal of the variable resistor, wherein a second terminal of the capacitor receives a reference voltage.

11. The POR signal generating apparatus according to claim 9, wherein the delay circuit comprises:

a first transistor, comprising a control terminal coupled to the output terminal of the detection circuit to receive the POR signal, wherein a first terminal of the first transistor is configured to receive the power voltage;

a second transistor, comprising a control terminal coupled to the output terminal of the detection circuit to receive the POR signal, wherein a first terminal of the second transistor is coupled to a second terminal of the first transistor, and a second terminal of the second transistor receives a reference voltage;

a transistor string, comprising a first terminal configured to receive the power voltage, wherein a second terminal of the transistor string outputs the delayed signal, and a control terminal of the transistor string is coupled to the second terminal of the first transistor and the first terminal of the second transistor; and a third transistor, comprising a control terminal coupled to the second terminal of the transistor string, wherein a first terminal and a second terminal of the third transistor receive the reference voltage.

12. The POR signal generating apparatus according to claim 9, wherein the first buffer comprises:

a first transistor, comprising a control terminal coupled to the output terminal of the delay circuit to receive the delayed signal, wherein a first terminal of the first transistor is configured to receive the power voltage;

a second transistor, comprising a control terminal coupled to the output terminal of the delay circuit to receive the delayed signal, wherein a first terminal of the second transistor is coupled to a second terminal of the first transistor, and a second terminal of the second transistor outputs the enable signal;

a third transistor, comprising a control terminal coupled to the output terminal of the delay circuit to receive the delayed signal, wherein a first terminal of the third transistor is coupled to the second terminal of the second transistor;

a fourth transistor, comprising a control terminal coupled to the output terminal of the delay circuit to receive the delayed signal, wherein a first terminal of the fourth transistor is coupled to a second terminal of the third transistor, and a second terminal of the fourth transistor receives a reference voltage;

a fifth transistor, comprising a control terminal coupled to the second terminal of the second transistor, wherein a first terminal of the fifth transistor is coupled to the second terminal of the first transistor, and a second terminal of the fifth transistor receives the reference voltage; and a sixth transistor, comprising a control terminal coupled to the second terminal of the second transistor, wherein a first terminal of the sixth transistor is coupled to the second terminal of the third transistor, and a second terminal of the sixth transistor receives the power voltage.

13. The POR signal generating apparatus according to claim 9, wherein the trigger circuit further comprises:

a second switch, comprising a control terminal coupled to the output terminal of the detection circuit to receive the POR signal, wherein a first terminal of the second switch is coupled to the input terminal of the first buffer, and a second terminal of the second switch receives a reference voltage;

wherein the second switch is turned off when the POR signal is in the ready state, and the second switch is turned on when the POR signal is in the not ready state.

14. The POR signal generating apparatus according to claim 9, wherein the trigger circuit further comprises:

a second switch, comprising a control terminal configured to receive the power voltage, wherein a first terminal of the second switch is coupled to the input terminal of the first buffer, and a second terminal of the second switch receives a reference voltage;

wherein the second switch is turned on when the control circuit is not powered on, and the second switch is turned off when the control circuit is powered on.

15. An operation method of a power on ready (POR) signal generating apparatus, comprising:

detecting a target voltage by a detection circuit, comprising:

receiving the target voltage to generate a delayed target voltage by a delay circuit of the detection circuit; and comparing the delayed target voltage with a first reference voltage to obtain a comparison result and setting a POR signal according to the comparison result by a voltage detection circuit of the detection circuit;

setting, by the detection circuit, the POR signal to a ready state when the target voltage is ready; and maintaining the POR signal in the ready state and disabling the detection circuit by a control circuit after the POR signal transitions from a not ready state to the ready state.

16. The operation method according to claim 15, further comprising:

enabling, by the control circuit, the detection circuit when the POR signal is in the not ready state.

* * * * *